(12) United States Patent
Mitova et al.

(10) Patent No.: US 12,111,709 B2
(45) Date of Patent: Oct. 8, 2024

(54) DETECTION OF A FAILURE OF A POWER MODULE BASED ON OPERATING CONDITIONS

(71) Applicant: Schneider Electric Industries SAS, Rueil Malmaison (FR)

(72) Inventors: Radoslava Mitova, Meylan (FR); Alain Dentella, Beaucroissant (FR); Pierre-Yves Boyer, Voiron (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 343 days.

(21) Appl. No.: 16/937,760

(22) Filed: Jul. 24, 2020

(65) Prior Publication Data

US 2021/0034129 A1     Feb. 4, 2021

(30) Foreign Application Priority Data

Aug. 2, 2019   (EP) ..................................... 19306001

(51) Int. Cl.
*G06F 1/28*        (2006.01)
*H03K 17/08*    (2006.01)

(52) U.S. Cl.
CPC ............... *G06F 1/28* (2013.01); *H03K 17/08* (2013.01); *H03K 2017/0806* (2013.01)

(58) Field of Classification Search
CPC ... G06F 1/28; H03K 17/08; H03K 2017/0806
See application file for complete search history.

(56) References Cited

U.S. PATENT DOCUMENTS

| | | | |
|---|---|---|---|
| 5,923,135 A * | 7/1999 | Takeda | B60L 50/51 318/432 |
| 9,513,628 B2 * | 12/2016 | Crepet | G05B 23/0254 |
| 9,952,275 B2 * | 4/2018 | Chen | G01R 31/2601 |
| 10,705,133 B2 * | 7/2020 | Degrenne | G01R 31/2642 |

(Continued)

FOREIGN PATENT DOCUMENTS

| | | | |
|---|---|---|---|
| CN | 101950187 A | * | 1/2011 |
| CN | 101895349 B | * | 3/2013 |

(Continued)

OTHER PUBLICATIONS

Extended European Search Report for EP Application No. 19306001.9 dated Feb. 21, 2020, 8 pages.

(Continued)

*Primary Examiner* — Metasebia T Retebo
*Assistant Examiner* — James G Yeaman
(74) *Attorney, Agent, or Firm* — Locke Lord LLP

(57) ABSTRACT

A method for detecting a failure of a power module, the method comprising the following operations:
  storing at least one model comprising regular temperature values associated with different operating conditions of the power module;
  acquiring at least a first temperature value from a first temperature sensor located in the vicinity of the power module;
  determining current operating conditions of the power module;
  comparing the current operating conditions and at least the first temperature value with the at least one stored model;
  based on the comparison, determining a failure of the power module.

14 Claims, 3 Drawing Sheets

(56) References Cited

U.S. PATENT DOCUMENTS

| | | | | |
|---|---|---|---|---|
| 2012/0130576 A1* | 5/2012 | Sugiyama | ............... | B60L 15/00 903/903 |
| 2012/0136348 A1* | 5/2012 | Condie | ................. | A61B 18/14 606/34 |
| 2012/0143417 A1* | 6/2012 | Chung | ................. | B60W 10/08 903/903 |
| 2014/0238044 A1* | 8/2014 | Lau | ........................ | A42B 1/008 62/3.2 |
| 2015/0330924 A1* | 11/2015 | Budde | ..................... | F24F 11/39 374/142 |
| 2018/0223746 A1* | 8/2018 | Mack | ..................... | F02B 73/00 |
| 2019/0012846 A1* | 1/2019 | Tonet | ....................... | G07C 3/00 |

FOREIGN PATENT DOCUMENTS

| | | | | |
|---|---|---|---|---|
| CN | 103226185 A | * | 7/2013 | |
| CN | 105387565 B | * | 3/2018 | |
| CN | 208062613 U | * | 11/2018 | |
| CN | 109362232 A | * | 2/2019 | ......... B60H 1/00278 |
| DE | 212017000207 U1 | * | 6/2019 | ............... B25F 5/00 |
| EP | 2645553 A2 | | 10/2013 | ............... H02J 3/36 |
| JP | H10199923 A | * | 7/1998 | |
| JP | 2008227293 A | * | 9/2008 | |
| JP | 2010035386 A | * | 2/2010 | |
| KR | 0158982 B1 | * | 3/1999 | |
| KR | 100603216 B1 | * | 7/2006 | |
| WO | WO-0153674 A1 | * | 7/2001 | ............. F01P 11/14 |
| WO | WO-2007117521 A2 | * | 10/2007 | ................ H02J 1/10 |
| WO | WO-2015101465 A1 | * | 7/2015 | .......... H01M 10/486 |
| WO | WO-2016084324 A1 | * | 6/2016 | ............. H01L 25/07 |
| WO | WO2017/135333 | | 8/2017 | |
| WO | WO-2018116667 A1 | * | 6/2018 | ............. H01G 17/00 |

OTHER PUBLICATIONS

Wang, H., et al., "Transitioning to physics-of-failure as a reliability driver in power electronics", IEEE Journal of Emerging and Selected Topics in Power Electronics, vol. 2, No. 1, Mar. 2014, pp. 97-114.

Rajaguru, P. et al., "Application of nonlinear fatigue damage models in power electronic module wirebond structure under various amplitude loadings" Springer, 2014, pp. 239-250.

Patil, N., et al., "A Fusion Approach to IGBT Power Module Prognostics", 10th. Int. Conf. on Thermal Mechanical and Multiphysics Simulation and Experiments in Micro-Electronics and Micro-Systems, EuroSimE 2009, 5 pages.

Musallam, M., et al., "An Efficient Implementation of the Rainflow Counting Algorithm for Life Consumption Estimation", IEEE Transitions on Reliability, vol. 61, No. 4, Dec. 2012, pp. 978-986.

Denk, M., "Efficient online-algorithm for the temperature cycle recording of an IGBT power module in a hybrid car during inverter operation", CIPS 2014, February, 25-27, 2014, Nuremberg/Germany, 6 pages.

* cited by examiner

DETECTION OF A FAILURE OF A POWER MODULE BASED ON OPERATING CONDITIONS

BACKGROUND

The present invention relates to the detection of aging/failure in an industrial device, such as, in particular while not exclusively, a power module.

A power module is a physical containment for power semiconductor devices used in power systems for converting electrical energy, such as DC converters, DC to AC inverters, ACDC-AC converters, etc. For example, a power module can be integrated in motor drives, Uninterruptible Power Source, UPS, or Photo Voltaic, PV, inverter. Power electronic converters are usually among the most critical assemblies in terms of failure level, lifetime and maintenance costs, in the field of renewable energy.

Motor drives are one of the most used power electronic converters in industrial applications: they drive electric motors of pumps, fans and conveyer belts, they move hoisting vehicles and elevators.

Power modules generally include components such as diodes, Metal Oxyde Semiconductor Field Effect device, MOSFET or Insulated Gate Bipolar Transistors, IGBTs.

In the power systems, power modules with IGBT, MOSFET and diodes are key components. In operation, they are prone to different environmental and functional stress factors, such as the ambient temperature, thermal cycling, vibrations, humidity, etc.

Due to power and thermal cycling, the power modules are subjected to thermomechanical damage accumulation, overvoltage or overcurrent, which affects their lifetime and therefore impacts on the power modules reliability.

Some of the failures of power modules may be due to solder delamination between the dies and the ceramic substrate inside of the power module or between a power module baseplate and the heatsink. They may also be due to thermal grease aging between the power module and the heatsink. They may also be due to wire-bond lift off between the semiconductor and electrical contacts of the module. Also, when a fan grid is covered with some dust, the cooling function performed by the fan is less efficient.

Therefore, different types of failures may affect the power module.

According to the prior art, lifetime models based on Physics-of-Failure, PoF, have been developed to monitor common failures in power modules and to replace handbook-based constant failure rate models. For example, refer to:

H. Wang et al., "*Transitioning to physics-of-failure as a reliability driver in power electronics*" IEEE J. Emerg. Sel. Top. Power Electron., vol. 2, no. 1, pp. 97-114, March 2014; and N. Patil, D. Das, C. Yin, H. Lu, C. Bailey, M. Pecht "*A Fusion approach to IGBT power module prognostics*" in Proc. 13th Int. Conf. Thermal, Mech. Multi-Phys. Simul. Exp. Microelectron. Microsyst., Delft, The Netherlands, 2009, pp. 215-220.

The PoF approach is a methodology based on root-cause failure mechanism analysis and the impact of materials, defects, and stresses on product reliability. For a given component, there could be multiple failure mechanisms, which should be identified individually.

These lifetime models are based on junction temperature evolution data and counting 15 algorithm technique with a linear or non-linear damage model. Junction temperature refers to die temperature in electronic components such as the IGBTs.

See for example:

M. Musallam and C. Mark Johnson, "*An efficient implementation of the rainflow counting algorithm for life consumption estimation*" IEEE Trans. Rel., vol. 61, no. 4, pp. 978-986, December 2012;

M. Denko "*Efficient online-algorithm for the temperature cycle recording of an IGBT power module in a hybrid car during inverter operation*" in Proc. CIPS, 2014, pp. 25-27; and P. Rajaguru, H. Lu, C. Bailey, "*Application of nonlinear fatigue damage models in power electronic module wire bond structure under various amplitude loadings*" Springer, pp. 239-250, 2014.

However, online measurements of junction temperature based on dedicated circuits is a complex task and remains difficult to implement for determining the junction temperature in real switching applications such as Pulse Width Modulation, PWM, operations using IGBTs in 30 frequency converters.

There is therefore a need to identify a failure, and possibly to differentiate between different types of failures, in power modules without complex calculations.

SUMMARY OF INVENTION

It is an object of the invention to alleviate at least some of the disadvantages mentioned above.

A first aspect of the invention concerns a method for detecting a failure of a power module, the method comprising the following operations:

storing at least one model comprising regular temperature values associated with different operating conditions of the power module;

acquiring at least a first temperature value from a first temperature sensor located in the vicinity of the power module;

determining current operating conditions of the power module;

comparing the current operating conditions and at least the first temperature value with the at least one stored model;

based on the comparison, determining a failure of the power module.

This enables to efficiently detect a failure of the power module, as the operating conditions are taken into account.

According to some embodiments, the first temperature sensor may be a Negative Temperature Coefficient, NTC, sensor.

The benefit of an NTC sensor is its time constant which is much lower than the time constant of other sensors and which allows to quickly detect temperature variations. It is also to be noted that most of the power modules natively include an NTC sensor. However, it is merely used in the prior art systems to protect the power module against overtemperature. Using an NTC sensor therefore does not impact the cost the power module as it is generally already present in it.

In complement, the first temperature sensor may be arranged for measuring the temperature on a die of the power module.

According to some embodiments, the method may further comprise acquiring at least one second temperature value from a second temperature sensor located in the vicinity of a heatsink associated with the power module, and the current operating conditions and the first and second temperature values may be compared with the at least one stored model.

Using two temperature sensors allow increasing the accuracy when detecting the failure of the power module.

In complement, the method may further comprise:
acquiring first temperature values at different instants from a first temperature sensor located in the vicinity of the power module;
acquiring second temperature values at the different instants, from a second temperature sensor located in the vicinity of the heatsink;
comparing the evolution of the first temperature values with at least one first predetermined curve of the model and comparing the evolution of the second temperature values with at least one second predetermined curve of the model;
based on both comparisons, determining a failure of the power module.

This embodiment enables to improve the accuracy of the detection of failure.

According to some embodiments, the method may further comprise determining a type of failure of the power module based on the comparison of the current operating conditions and the first and second temperature values with the at least one stored model.

This allows differentiating between different types of failures.

According to some embodiments, the method may further comprise acquiring at least one ambient temperature value and the current operating conditions, the first temperature value and the ambient temperature may be compared with the at least one stored model.

This enables to increase the accuracy of failure detection.

According to some embodiments, the operating conditions may comprise any combination of the following elements:
output current of the power module;
input voltage of 5 the power module;
output voltage of the power module;
input current of the power module
speed of a motor comprising the power module;
torque of a motor comprising the power module and/or an ambient temperature value.

According to some embodiments, the at least one model may be determined during a preliminary phase comprising:
acquiring regular temperature values of the power module for respective operating conditions;
determining the at least one model based on the regular temperature values corresponding to the respective operating conditions.

This enables to initially build the model using the same hardware material than those used for the detection of failure.

In complement, the operating conditions of the power module can be controlled to acquire respective regular temperature values during the preliminary phase.

According to some embodiments, an alarm can be generated when the failure of the power module is determined.

According to some embodiments, the method comprises, before acquiring the first temperature value, detecting that the power module is in stable operating conditions.

Therefore, the detection of failure is more accurate.

A second aspect of the invention concerns a non-transitory computer readable storage medium, with a computer program stored thereon, said computer program comprising instructions for, when executed by a processor, carrying out the steps of a method according to the first aspect of the invention.

A third aspect of the invention concerns a device configured for detecting a failure of a power module, the device comprising:
a memory storing at least one model comprising regular temperature values associated with different operating conditions of 5 the power module;
a module for acquiring at least a first temperature value from a first temperature sensor located in the vicinity of the power module;
a processor configured for:
determining current operating conditions of the power module;
comparing the current operating conditions and at least the first temperature value with the at least one stored model;
based on the comparison, determining a failure of the power module.

Further objects, aspects, effects and details of the invention are described in the following detailed description of number of exemplary embodiments, with reference to the drawings.

BRIEF DESCRIPTION OF DRAWINGS

By way of example only, the embodiments of the present disclosure will be described with reference to the accompanying drawing, wherein.

DETAILED DESCRIPTION

Figure 1:
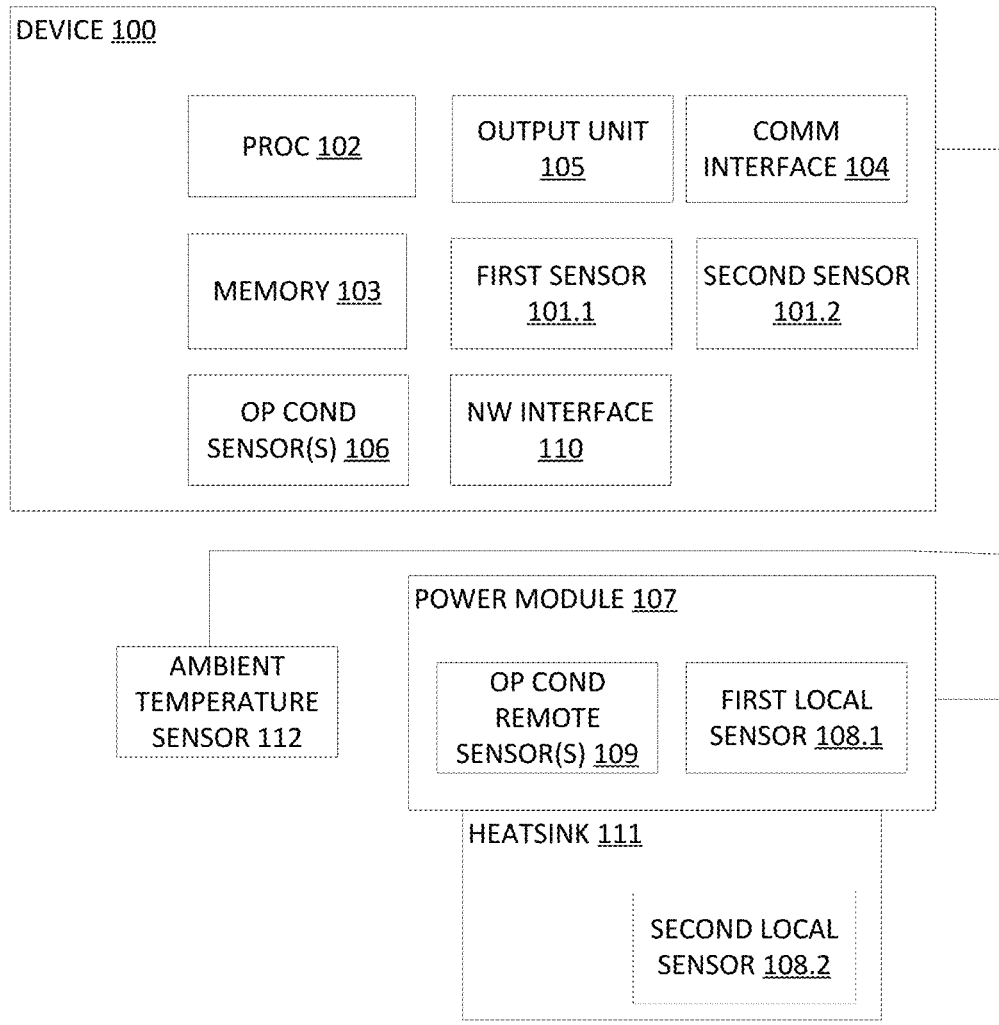
FIG. 1 illustrates a system according to some embodiments of the invention.

Referring to FIG. 1, there is shown a device 100 for detecting a failure, and optionally a type of failure, in a power module 107 according to some embodiments of the invention. The device 100 can be integrated in a system comprising the power module 107. The power module 107 can be integrated in a larger power system such as a power converter for example (DC converters, DC to AC inverters, AC-DC-AC converters, etc). In what follows, the example of a power module 107 integrated in a motor drive is considered, for illustrative purposes exclusively.

No restriction is attached to the power module 107, which can be any equipment participating in a power system and comprising elements such as diodes, MOSFETS and/or Insulated Gate Bipolar Transistors, IGBTs. The power module 107 may have a layer structure comprising chips mounted on substrates, the substrates being mounted on baseplates and/or heatsink 111.

The power module 107 may for example consist of an assembly of numerous dies (depending on a power rating). For example, the power module 107 may comprise a combination of diodes and IGBTs corresponding to respective dies.

The power module 107 is associated with a heatsink 111 that is configured for dissipating the heat generated by the power module 107.

The device 100 comprises at least a first sensor 101.1 that is configured for acquiring first temperature values representative of the temperature of the power module 107, and a second sensor 101.2 that is configured for acquiring second temperature values representative of the temperature of the power module 107. For example, the device 100 can be a probe where the sensors 101.1 and 101.2 are movable to be placed in the vicinity of the power module 107 and of the heatsink 111, respectively.

Preferably, the first and second sensors are directly integrated on the power module 107 and the heatsink 111 as first and second local sensors 108.1 and 108.2 configured to respectively acquire the first and second temperature values, instead of first and second sensors 101.1 and 101.2. To this end, the device 100 may comprise a communication interface 104 that is configured to communicate with the at least two first and second remote sensors 108.1 and 108.2 located in the vicinity or inside of the power module 107 and the heatsink 111. The first local sensor 108.1 is configured for acquiring first temperature values representative of the temperature of the power module 107, and the second local sensor 108.2 is configured for acquiring second temperature values representative of the temperature of the heatsink 111.

According to some embodiments of the invention, the first (local) sensor 101.1 or 108.1 may be a Negative Temperature Coefficient, NTC, sensor. The benefit of an NTC sensor is its time constant which is much lower than the time constant of other sensors and which allows to quickly detect temperature variations. It is also to be noted that most of the power modules natively include an NTC sensor. However, it is merely used in the prior art systems to protect the power module against overtemperature.

Using an NTC sensor therefore does not impact the cost the power module 107 as it is generally already present in it.

Also, according to some embodiments, the system may comprise a third sensor 112 that may be an ambient temperature sensor, configured to measure the ambient temperature, such as an ambient temperature of a room in which the power module 107 is located. The ambient temperature sensor 112 can be integrated in the device 100 or can be external to it and communicate with it via the communication interface 104.

Using two or three sensors allows distinguishing between several types of failures. The fact of using two or three sensors located separately also allows to increase the accuracy in determining the type of failure.

For example, failure of the power module 107 can be detected by a rise of the temperature sensed by the NTC sensor 101.1 or 108.1, while the temperature sensed by the heatsink sensor 101.2 or 108.2 is not affected (remains substantially constant). In case of heatsink failure (or degraded mode of the heatsink 111), both temperatures sensed by the NTC sensor 101.1 or 108.1 and the heatsink sensor 101.2 or 108.2 are rising (while the ambient temperature may be stable).

Figure 2:
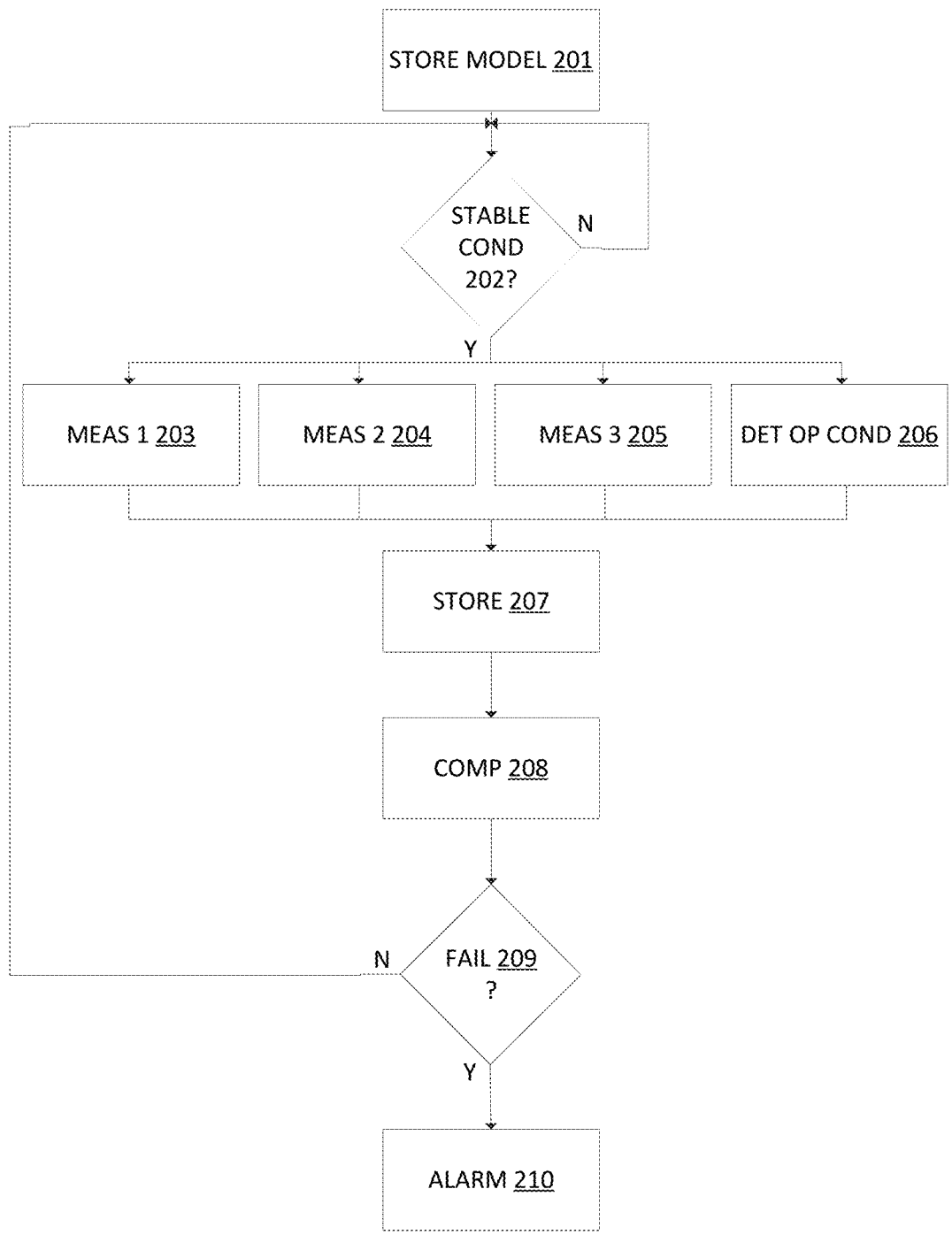
FIG. 2 is a flowchart showing steps of a method according to some embodiments of the invention.

The device 100 may further comprise a processor 102 and a memory 103, which are configured for performing the steps of the method illustrated on FIG. 2.

The device 100 may further comprise a network interface 110, which is configured to communicate with an external network, such as an IP network. No restriction is attached to the network interface 110, which can be wireless (Wifi, Bluetooth, or others) or wired (Ethernet for example).

The device 100 further comprises a sensor 106 configured for sensing data representative of operating conditions of the power module. Operating conditions may comprise:
Output current of the power module 107;
Input current of the power module;
Input voltage of the power module 107;
Output voltage of the power module 107;
Speed of a motor comprising the power module 107;
Torque of a motor comprising the power module 107; and/or
an ambient temperature value.

Sensors for acquiring such data are already known and are not further described.

The third temperature sensor 112 used for sensing the ambient temperature may also be used to determine the operating conditions.

Based on the data acquired by the sensor 106, and optionally on the first and second temperature values and on the ambient temperature value, current operating conditions of the power module 107 or of the power system integrating the power module 107, can be determined.

Operating conditions may for example correspond to a motor drive output power and/or speed, frequency, and/or torque of a motor when the power module 107 is integrated in a motor drive.

Alternatively, and preferably, the power module 107 may comprise an operating conditions local sensor 109 (instead of the device 100 comprising the sensor 106) and the measures acquired by the operating conditions remote sensor 109 are communicated to the device 100 via the communication interface 104.

The memory 103 of the device 100 may store at least one model at least comprising regular temperature values associated with one or several operating conditions of the power module 107 or of the power system integrating the power module 107. For example, the model illustrated on FIG. 3 and described hereafter may be stored in the memory 103.

FIG. 2 is a diagram showing the steps of a method according to some embodiments of the invention.

At step 201, at least one model is stored in the memory 103. As explained above, the model at least comprises regular temperature values associated with different operations conditions of the power module 107. For example, the model illustrated on FIG. 3 described hereafter may be stored at step 201.

Step 201 may be a preliminary step that is implemented before the power module is commissioned or implemented before a device comprising the power module is started. For example, each time the power system comprising the power module 107 is started, the device 100 may check, via the network interface 110, that the stored model is up to date. If not, an updated version of the model can be downloaded and stored in the device 100.

Step 201 can also be performed during a commissioning phase of the power module 107 (or of the power system integrating the power module). During this phase, temperature values are obtained for different operating conditions, based on the measures of the sensors 101.1, 101.2, 108.1, 108.2, 106, 109 and/or 112. These temperature values may be stored in association with the operating conditions to which they correspond and can be considered as healthy state of the power module 107 or of the power system integrating the power module 107. During the commissioning phase, the motor can be controlled to operate at different operating conditions, so that temperature values can be obtained for each of the different operating conditions. For example, the motor can be controlled to operate at frequencies of 5, 10, 20, 30, 40 and 50 Hz. The model may also be built using machine learning algorithms.

At step 202, the device 100 checks via the sensors 101.1, 101.2, 106, 108.1, 108.2 and/or 112 whether the power module 107 is on and is functioning under stable operating conditions or not. For example, this can be determined by observing the variations of the measures sensed by the sensors 101.1, 101.2, 106, 108.1, 108.2 and/or 112.

If the power module 107 is functioning under stable operating conditions, the method goes to steps 203 to 205. Else, the method remains at step 202 until stable operating conditions are reached.

At step 203, the device 100 acquires (from the first temperature sensor 101.1) or receives (from the first local temperature sensor 108.1) first temperature values. As explained above, the first temperature values can be acquired by an NTC sensor, for example located on one of the dies of the power module 107 and may be representative of the temperature of the die of the power module 107.

At step 204, which is optional, the device 100 acquires (from the second temperature sensor 101.2) or receives (from the local temperature sensor 108.2) second temperature value(s). As explained above, the second temperature values can be acquired by a heatsink temperature sensor and may be representative of the temperature in the vicinity of the heatsink 111.

At step 205, which is also optional, the device 100 acquires from the ambient temperature sensor 112 ambient temperature value(s).

At step 206, the device 100 determines current operating conditions of the power module 107, based on data sensed by the operating condition sensors 106 and/or 109, and optionally by one or several of the sensors 101.1, 101.2, 108.1, 108.2 and 112.

Steps 203, 204, 205 and 206 can be performed simultaneously or sequentially (in any order).

At step 207, which is optional, the data acquired at steps 203 and 206, and optionally at steps 204 and 205, can be stored in association with a date in the memory 103.

Figure 3:
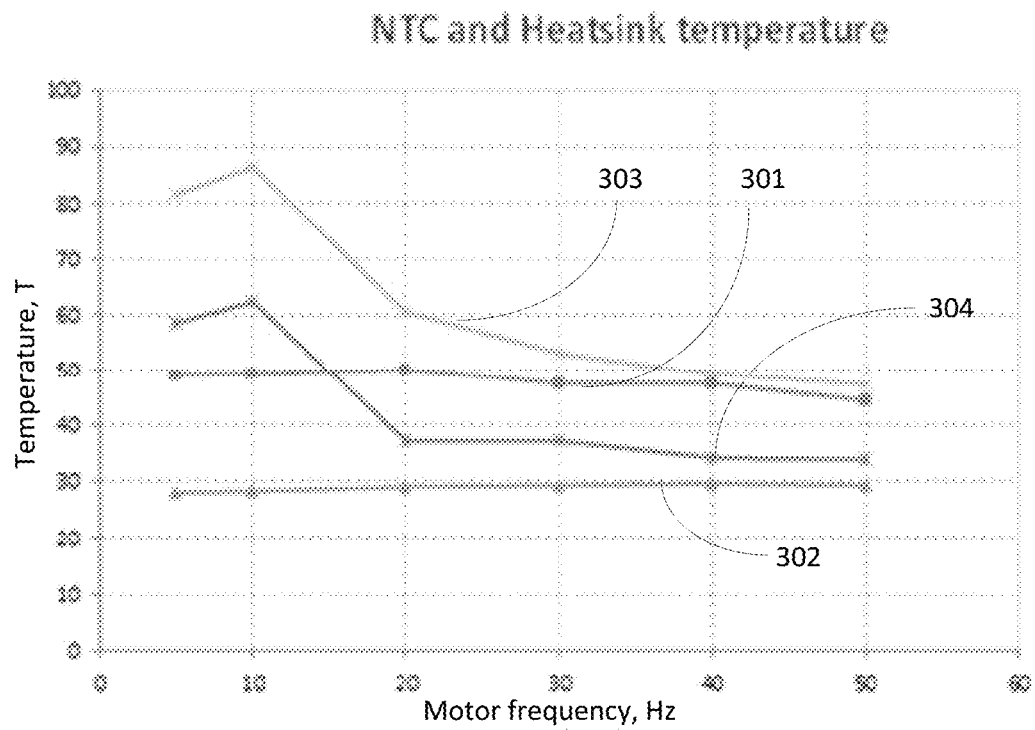
FIG. 3 shows curves of a stored model according to some embodiments of the invention.

FIG. 3 shows a model according to some embodiments of the invention, that can be stored at step 201 discussed above.

The model may comprise:
a first curve 301 showing the evolution of the NTC temperature values (first temperature values) for different operating conditions (frequencies of the motor for example); and
a second curve 302 showing the evolution of the heatsink temperature values (second temperature values) for different operating conditions (frequencies of the motor for example).

Optionally, the model may also comprise curves 303 and 304, which correspond to situations where the heatsink is defective (fan failure for example). 303 represents the NTC temperature values depending on the motor frequency and 304 represents the heatsink temperature values depending on the motor frequency, in that situation.

In the embodiment where the model comprises curves 301 and/or 302 (but does not comprise curves 303 and 304), a failure can be detected when the measured temperature values differ from the temperature values of the model from more than a preset threshold value.

In the embodiment where the model further comprises curves 303 and 304, a failure can be detected when a measured temperature value is closer to curve 303/304 than to curve 301/302.

No restriction is attached to the model, which at least comprises a set of temperature values corresponding to different operating conditions. Also, no restriction is attached to the set of rules that is used to detect whether there is a failure or not.

It is to be noted that, in the example of FIG. 3, the output power of the motor drive has been reduced for frequencies above 30 Hz, because of the limited power of the load: for this reason, the first and second temperature values are lower when the motor frequency is increasing.

As explained above, the model of FIG. 3 can be obtained by measuring the first and second temperature values during a commissioning phase where the motor is controlled to operate at different frequencies, such as 5, 10, 20, 30, 40 and 50 Hz.

Figure 4:
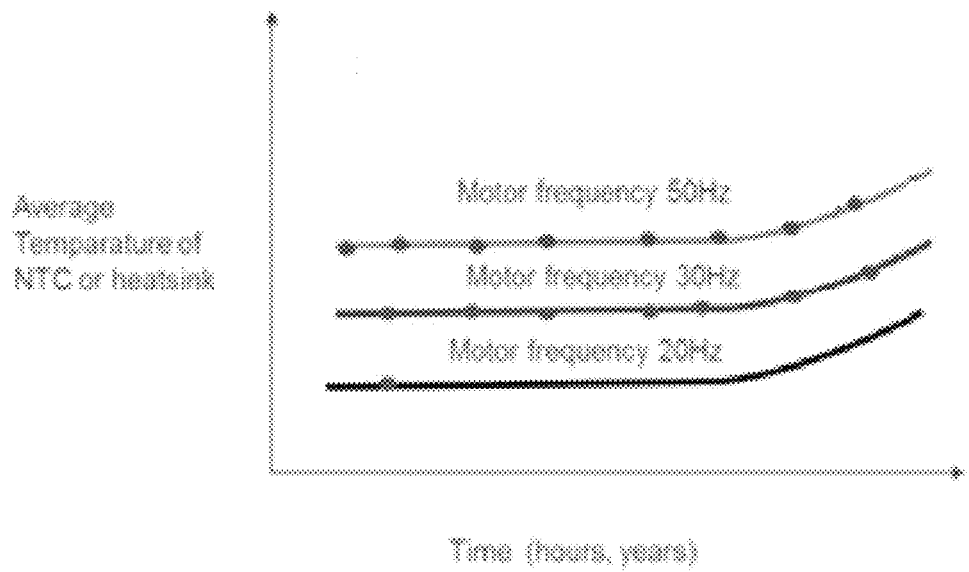
FIG. 4 shows the evolution of temperature of a power module for different operating conditions, depending on time.

FIG. 4 shows the evolution of the average NTC or heatsink temperature values over time for different operating conditions, such as motor frequencies 20, 30 and 50 Hz.

As shown on FIG. 4, NTC or heatsink temperature values are rising after a certain amount of time, which means that aging of the power module 107 or of the power system integrating the power module 107 can be detected when such a rise is measured.

The graph of FIG. 4 can therefore be used to define a temperature threshold for each operating condition, above which it is detected that the power module is aged and should be replaced.

Referring back to FIG. 2, at step 208, the device 100 compares the temperature measurements obtained at steps 203 and 205, and optionally at steps 204 and 205, and the operating conditions determined at step 206, with the at least one model stored in memory 103, and determines, based on the comparison, at step 209, whether a failure is detected or not.

If a failure is detected, an alarm can be issued at step 210. Alternatively, a message can be sent to an operator or to a centralized system (SCADA for example). According to another alternative, or complementary embodiment, the power system comprising the power module 107 may be stopped upon detection of a failure.

If a failure is not detected, the method may go back to step 202.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A method for detecting a failure of a power module, the method comprising the following operations:
storing at least one model comprising regular temperature values associated with different operating conditions of the power module, the regular temperature values of the at least one model represented by at least one first predetermined curve and at least one second predetermined curve that is different from the at least one first predetermined curve;
checking whether the at least one stored model is up to date, determining that the at least one stored model is not up to date, and replacing the at least one stored model with an updated version thereof after determining that the at least one stored model is not up to date;
acquiring at least a first temperature value from a first temperature sensor located in the vicinity of the power module;
determining current operating conditions of the power module;
comparing the current operating conditions and at least the first temperature value with the at least one stored model;
based on the comparison, determining a failure of the power module.

2. The method according to claim 1, wherein the first temperature sensor is a Negative Temperature Coefficient, NTC, sensor.

3. The method according to claim 2, wherein the first temperature sensor is arranged for measuring the temperature on a die of the power module.

4. The method according to claim 1, further comprising acquiring at least one second temperature value from a second temperature sensor located in the vicinity of a heatsink associated with the power module, and wherein the current operating conditions and the first and second temperature values are compared with the at least one stored model.

5. The method according to claim 4, wherein the method comprises:
acquiring first temperature values at different instants, from a first temperature sensor located in the vicinity of the power module;
acquiring second temperature values at the different instants, from a second temperature sensor located in the vicinity of the heatsink;
comparing the evolution of the first temperature values with the at least one first predetermined curve of the at least one model and comparing the evolution of the second temperature values with the at least one second predetermined curve of the at least one model;
based on both comparisons, determining a failure of the power module.

6. The method according to claim 4, comprising determining a type of failure of the power module based on the comparison of the current operating conditions and the first and second temperature values with the at least one stored model.

7. The method according to claim 1, further comprising acquiring at least one ambient temperature value and wherein the current operating conditions, the first temperature value and the ambient temperature are compared with the at least one stored model.

8. The method according to claim 1, wherein the operating conditions comprise any combination of the following elements:
output current of the power module;
input voltage of the power module;
output voltage of the power module;
input current of the power module
speed of a motor comprising the power module;
torque of a motor comprising the power module and/or an ambient temperature value.

9. The method according to claim 1, wherein the at least one model is determined during a preliminary phase comprising:
acquiring regular temperature values of the power module for respective operating conditions;
determining the at least one model based on the regular temperature values corresponding to the respective operating conditions.

10. The method according to claim 9, wherein the operating conditions of the power module are controlled to acquire respective regular temperature values during the preliminary phase.

11. The method according to claim 1, wherein, an alarm is generated when the failure of the power module is determined.

12. The method according to claim 1, wherein the method comprises, before acquiring the first temperature value, detecting that the power module is in stable operating conditions.

13. A non-transitory computer readable storage medium, with a computer program stored thereon, said computer program comprising instructions for, when executed by a processor, carrying out the steps of a method according to claim 1.

14. A device configured for detecting a failure of a power module, the device comprising:
a memory storing at least one model comprising regular temperature values associated with different operating conditions of the power module, the regular temperature values of the at least one model represented by at least one first predetermined curve and at least one second predetermined curve that is different from the at least one first predetermined curve;
a module for acquiring at least a first temperature value from a first temperature sensor located in the vicinity of the power module;
a processor configured for:
checking whether the at least one stored model is up to date, determining that the at least one stored model is not up to date, and replacing the at least one stored model with an updated version thereof after determining that the at least one stored model is not up to date;
determining current operating conditions of the power module;
comparing the current operating conditions and at least the first temperature value with the at least one stored model;
based on the comparison, determining a failure of the power module.

* * * * *